(12) United States Patent
Shen et al.

(10) Patent No.: US 11,307,321 B2
(45) Date of Patent: Apr. 19, 2022

(54) TRANSFERRING LOGGING DATA FROM AN OFFSET WELL LOCATION TO A TARGET WELL LOCATION

(71) Applicant: LANDMARK GRAPHICS CORPORATION, Houston, TX (US)

(72) Inventors: Xinpu Shen, Houston, TX (US); Guoyang Shen, Houston, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 995 days.

(21) Appl. No.: 15/780,145

(22) PCT Filed: Feb. 12, 2016

(86) PCT No.: PCT/US2016/017789
§ 371 (c)(1),
(2) Date: May 30, 2018

(87) PCT Pub. No.: WO2017/138954
PCT Pub. Date: Aug. 17, 2017

(65) Prior Publication Data
US 2018/0356551 A1    Dec. 13, 2018

(51) Int. Cl.
*G01V 1/50* (2006.01)
*G01V 3/38* (2006.01)
(Continued)

(52) U.S. Cl.
CPC .............. *G01V 1/50* (2013.01); *E21B 47/00* (2013.01); *G01V 3/18* (2013.01); *G01V 3/20* (2013.01); *G01V 3/38* (2013.01); *G01V 11/00* (2013.01); *H01L 23/147* (2013.01); *H01L 23/15* (2013.01); *H01L 23/481* (2013.01); *H01L 23/49822* (2013.01); *H01L 23/49844* (2013.01); *H01L 23/5383* (2013.01); *H01L 23/5389* (2013.01); *H01L 25/0657* (2013.01); *H01L 27/0255* (2013.01); *H01L 27/0676* (2013.01);
(Continued)

(58) Field of Classification Search
CPC ... G01V 1/50; G01V 3/20; G01V 3/38; G01V 2200/16; G01V 2210/6248
See application file for complete search history.

(56) References Cited

U.S. PATENT DOCUMENTS

| 4,541,275 A | 9/1985 | Kerzner |
| 5,615,115 A * | 3/1997 | Shilling .................. E21B 47/06 702/12 |

(Continued)

FOREIGN PATENT DOCUMENTS

WO    9104500 A1    4/1991

OTHER PUBLICATIONS

Zhang, "Pore pressure prediction from well logs: methods, modifications, and new approaches", Earth Science Reviews 108 (2011) pp. 50-63 (Year: 2011).*

(Continued)

*Primary Examiner* — Regis J Betsch
(74) *Attorney, Agent, or Firm* — Polsinelli PC

(57) ABSTRACT

Systems and methods for transferring logging data from an offset well location to a target well location by adjusting the logging data to account for the difference in correlated depths between the target well and the offset well where logging data is acquired.

18 Claims, 5 Drawing Sheets

(51) Int. Cl.
<table>
<tr><td>G01V 3/20</td><td>(2006.01)</td></tr>
<tr><td>G01V 3/18</td><td>(2006.01)</td></tr>
<tr><td>G01V 11/00</td><td>(2006.01)</td></tr>
<tr><td>E21B 47/00</td><td>(2012.01)</td></tr>
<tr><td>H01L 23/14</td><td>(2006.01)</td></tr>
<tr><td>H01L 23/15</td><td>(2006.01)</td></tr>
<tr><td>H01L 23/48</td><td>(2006.01)</td></tr>
<tr><td>H01L 23/498</td><td>(2006.01)</td></tr>
<tr><td>H01L 23/538</td><td>(2006.01)</td></tr>
<tr><td>H01L 25/065</td><td>(2006.01)</td></tr>
<tr><td>H01L 27/02</td><td>(2006.01)</td></tr>
<tr><td>H01L 27/06</td><td>(2006.01)</td></tr>
<tr><td>H01L 49/02</td><td>(2006.01)</td></tr>
<tr><td>H01L 29/66</td><td>(2006.01)</td></tr>
<tr><td>H01L 29/861</td><td>(2006.01)</td></tr>
</table>

(52) U.S. Cl.
CPC .......... *H01L 27/0688* (2013.01); *H01L 28/40* (2013.01); *H01L 29/6609* (2013.01); *H01L 29/861* (2013.01); *G01V 2200/16* (2013.01); *G01V 2210/6248* (2013.01)

(56) References Cited

U.S. PATENT DOCUMENTS

<table>
<tr><td>6,012,017 A *</td><td>1/2000</td><td>Van Bemmel</td><td>G01V 1/48<br>702/14</td></tr>
<tr><td>2006/0052937 A1*</td><td>3/2006</td><td>Zoraster</td><td>G01V 11/00<br>702/6</td></tr>
<tr><td>2006/0090934 A1</td><td>5/2006</td><td>Williams</td><td></td></tr>
<tr><td>2011/0216066 A1*</td><td>9/2011</td><td>Calvo</td><td>G06T 11/20<br>345/440</td></tr>
<tr><td>2014/0076632 A1*</td><td>3/2014</td><td>Wessling</td><td>E21B 47/06<br>175/48</td></tr>
<tr><td>2018/0356551 A1*</td><td>12/2018</td><td>Shen</td><td>G01V 1/50</td></tr>
</table>

OTHER PUBLICATIONS

Search Report; French Application No. 1750136; dated Jan. 24, 2019.
International Search Report and Written Opinion; PCT Application No. PCT/US2016/017789; dated Oct. 24, 2016.

* cited by examiner

TRANSFERRING LOGGING DATA FROM AN OFFSET WELL LOCATION TO A TARGET WELL LOCATION

CROSS-REFERENCE TO RELATED APPLICATIONS

This application is a national stage entry of PCT/US2016/017789 filed Feb. 12, 2016, said application is expressly incorporated herein in its entirety.

FIELD OF THE DISCLOSURE

The present disclosure generally relates to systems and methods for transferring logging data from an offset well location to a target well location. More particularly, the present disclosure relates to transferring logging data from an offset well location to a target well location by adjusting the logging data to account for the difference in correlated depths between the target well and the offset well where logging data is acquired.

BACKGROUND

Vertical offset wells are commonly drilled to provide stratigraphic information about a formation for drilling target wells. This type of geophysical data may be acquired during logging while drilling (LWD) operations and may include sonic, resistivity and gamma ray logging data hereinafter generally referred to a logging data. Logging data from an offset well may be correlated with a nearby target well by simply transferring the logging data acquired at a depth in the offset well to a correlated depth in the target well. This process is well known and often used to predict a pore pressure along the predicted trajectory of the target well. Because the logging data remains the same at a different correlated depth in the target well, the logging data transferred to the correlated depths along the predicted trajectory of the target well may not represent the most accurate logging data for the target well. This problem is compounded as the difference in correlated depths between the target well and the offset well increases.

BRIEF DESCRIPTION OF THE DRAWINGS

The present disclosure is described below with references to the accompanying drawings in which like elements are referenced with like reference numerals, and in which.

DETAILED DESCRIPTION OF THE PREFERRED EMBODIMENTS

Figure 1A:
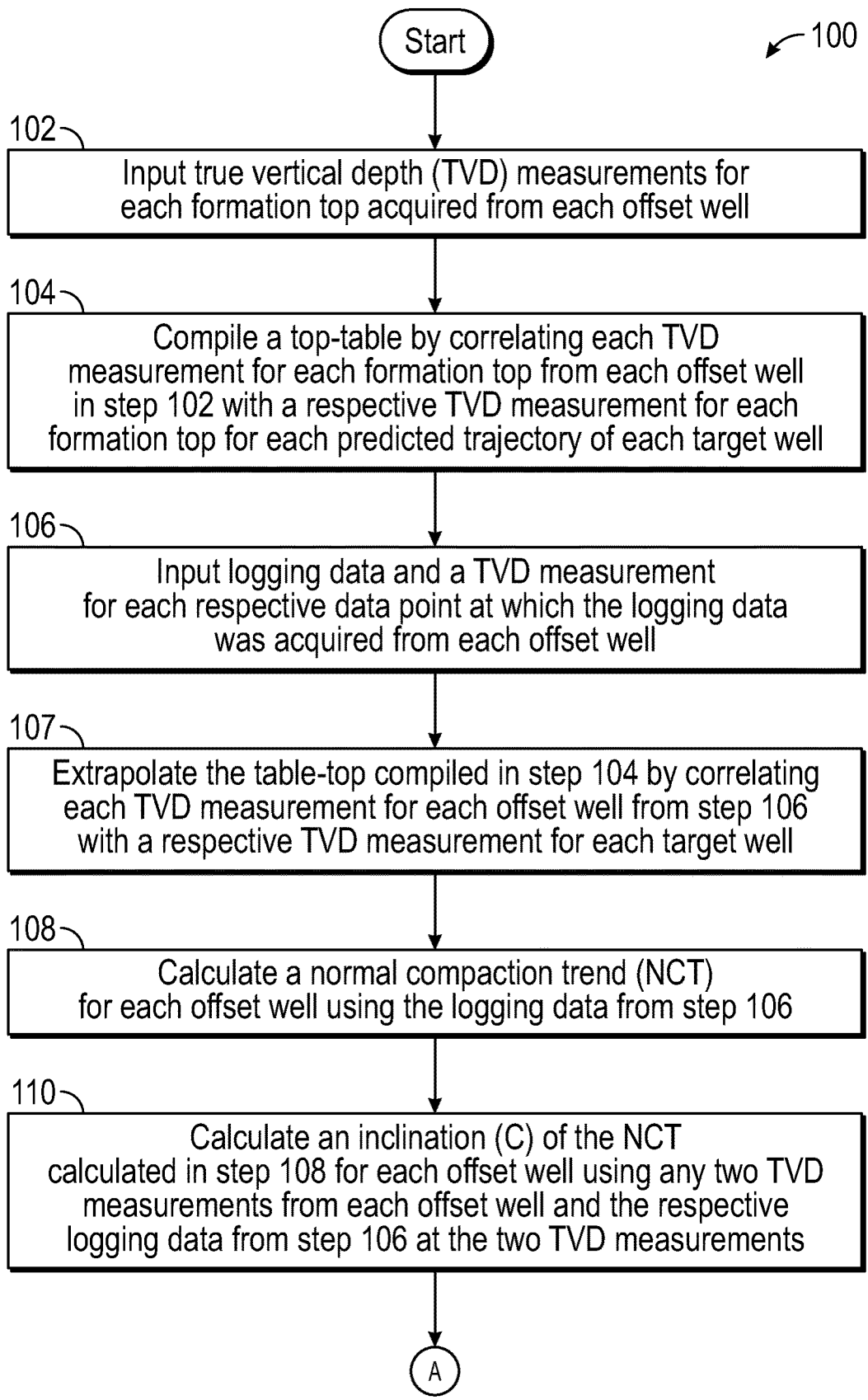
FIGS. 1A-1B are a flow diagram illustrating one embodiment of a method for implementing the present disclosure.

The present disclosure overcomes one or more deficiencies in the prior art by providing systems and methods for transferring logging data from an offset well location to a target well location by adjusting the logging data to account for the difference in correlated depths between the target well and the offset well where logging data is acquired.

In one embodiment, the present disclosure includes a method for transferring logging data from an offset well location to a target well location, which comprises: i) compiling a top-table by correlating each true vertical depth (TVD) measurement from an offset well with a respective TVD measurement for a predicted trajectory of a target well; ii) calculating a normal compaction trend for the offset well using logging data for the offset well; ii) calculating an inclination of the normal compaction trend using any two TVD measurements from the offset well and the respective logging data at the two TVD measurements; iv) calculating a logging data ratio for the logging data at each respective TVD measurement from the offset well using the inclination, each TVD measurement from the offset well, each correlated TVD measurement for the target well from the top-table and a computer processor; and v) transferring the logging data from the location of the offset well to the location of the target well by multiplying the logging data at each TVD measurement for the offset well by the logging data ratio for each respective TVD measurement from the offset well.

In another embodiment, the present disclosure includes a non-transitory program carrier device tangibly carrying computer executable instructions for transferring logging data from an offset well location to a target well location, the instructions being executable to implement: i) compiling a top-table by correlating each true vertical depth (TVD) measurement from an offset well with a respective TVD measurement for a predicted trajectory of a target well; ii) calculating a normal compaction trend for the offset well using logging data for the offset well; iii) calculating an inclination of the normal compaction trend using any two TVD measurements from the offset well and the respective logging data at the two TVD measurements; iv) calculating a logging data ratio for the logging data at each respective TVD measurement from the offset well using the inclination, each TVD measurement from the offset well, and each correlated TVD measurement for the target well from the top-table; and v) transferring the logging data from the location of the offset well to the location of the target well by multiplying the logging data at each TVD measurement for the offset well by the logging data ratio for each respective TVD measurement from the offset well.

In yet another embodiment, the present disclosure includes a non-transitory program carrier device tangibly carrying computer executable instructions for transferring logging data from an offset well location to a target well location, the instructions being executable to implement: i) compiling a top-table by correlating each true vertical depth (TVD) measurement from an offset well with a respective TVD measurement for a predicted trajectory of a target well; ii) calculating an inclination of a normal compaction trend for the offset well using any two TVD measurements from the offset well and respective logging data for the offset well at the two TVD measurements; iii) calculating a logging data ratio for the logging data at each respective TVD measurement from the offset well using the inclination, each TVD measurement from the offset well, and each correlated TVD measurement for the target well from the top-table; iv)

transferring the logging data from the location of the offset well to the location of the target well by multiplying the logging data at each TVD measurement for the offset well by the logging data ratio for each respective TVD measurement from the offset well; and v) using the logging data transferred to the target well location to predict a pore pressure along the predicted trajectory of the target well.

The subject matter of the present disclosure is described with specificity, however, the description itself is not intended to limit the scope of the disclosure. The subject matter thus, might also be embodied in other ways, to include different structures, steps and/or combinations similar to and/or fewer than those described herein, in conjunction with other present or future technologies. Moreover, although the term "step" may be used herein to describe different elements of methods employed, the term should not be interpreted as implying any particular order among or between various steps herein disclosed unless otherwise expressly limited by the description to a particular order. While the present disclosure may be described with respect to the oil and gas industry, it is not limited thereto and may also be applied in other industries (e.g. drilling water wells) to achieve similar results.

Method Description

Figure 1B:
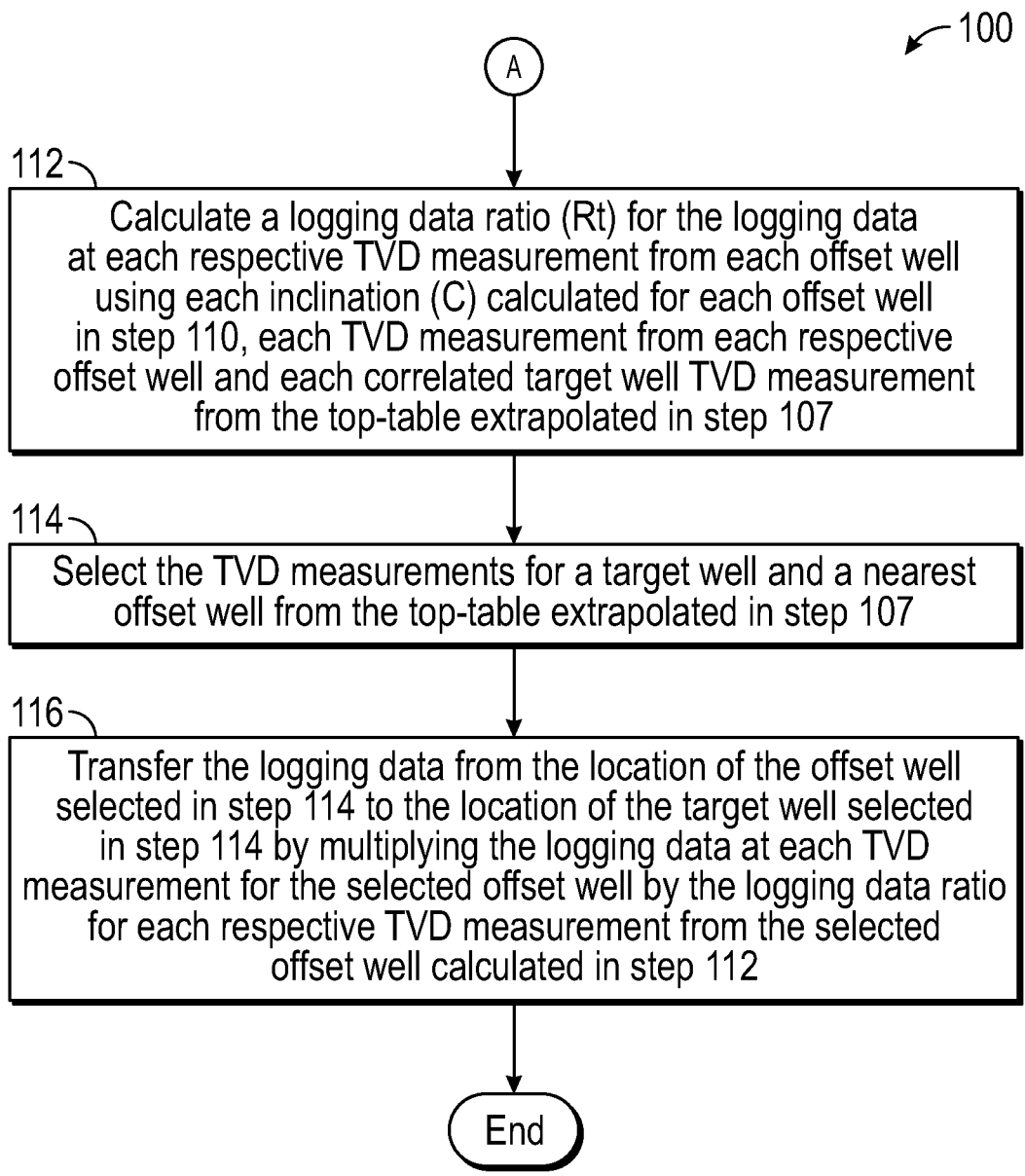

Referring now to FIGS. 1A-1B, a flow diagram illustrates one embodiment of a method 100 for implementing the present disclosure. Although the method 100 may be performed using most any type of logging data, sonic logging data is referred to in the equations used herein below. However, resistivity logging data may be used in the same equations to perform the method 100.

In step 102, true vertical depth (TVD) measurements for each formation top acquired from each offset well are input.

In step 104, a top-table is compiled by correlating each TVD measurement for each formation top from each offset well in step 102 with a respective TVD measurement for each formation top for each predicted trajectory of each target well (hereinafter target well) using techniques well known in the art.

In step 106, logging data (e.g. sonic or resistivity) and a TVD measurement for each respective data point at which the logging data was acquired from each offset well are input.

In step 107, the table-top compiled in step 104 is extrapolated by correlating each TVD measurement for each offset well from step 106 with a respective TVD measurement for each target well using techniques well known in the art.

In step 108, a normal compaction trend (NCT) is calculated for each offset well using the logging data from step 106 and techniques well known in the art.

In step 110, an inclination (C) of the NCT calculated in step 108 is calculated for each offset well using any two TVD measurements from each offset well and the respective logging data from step 106 at the two TVD measurements. In one embodiment, the inclination (C) of the NCT may calculated for each offset well using equation (1):

$$C = \frac{TVD_{p1} - TVD_{p0}}{\ln(d_{tcNP0}) - \ln(d_{tcNP1})} \quad (1)$$

where $d_{tcNP0}$ is the value of the sonic logging data acquired at the offset well location P0 with depth $TVD_{p0}$ and $d_{tcNP1}$ is the value of the sonic logging data at the offset well location P1 with depth $TVD_{p1}$. Compressive sonic interval velocity (i.e. sonic logging data) is thus, represented by Dc (unit: ft/micro second μ), and its inverse 1/Dc is represented by Dtc (unit: μ/ft). Subscript p0 indicates this value is related to location P0, and subscript N indicates this value is related to the NCT.

In step 112, a logging data ratio (Rt) is calculated for the logging data at each respective TVD measurement from each offset well using each inclination (C) calculated for each offset well in step 110, each TVD measurement from each respective offset well and each correlated target well TVD measurement from the top-table extrapolated in step 107. In one embodiment, the logging data ratio may be calculated for the logging data at each respective TVD measurement from each offset well using equation (2):

$$R_t = e^{(TVD1 - TVD0)/C} \quad (2)$$

where TVD0 and TVD1 are the correlated TVD measurements for an offset well and a target well, respectively, and C is the inclination for the offset well. A logging data ratio is thus, calculated for the logging data at each respective data point at which the logging data was acquired from each offset well. Equation (2) is derived from equations (3) and (4):

$$d_{tc1} = d_{tc0} r, \text{ with } r = \frac{d_{tcNP1}}{d_{tcNP0}} \quad (3)$$

$$ES = (OBG - PPG_N)\left(\frac{d_{cO}}{d_{cN}}\right)^E \quad (4)$$

where r is the ratio defined in equation (3); and, ES is the effective vertical stress, OBG is the overburden stress, $PPG_N$ is the normal formation's pore-pressure, which is hydrostatic, $d_{cN}$ is the value of the calculated sonic logging data of the formation with normal compaction history and $d_{cO}$ is the value of the measured sonic logging data of the formation in equation (4). Equations (5) and (6) are derived from equation (4):

$$ES_0 = (OBG0 - PPG_{N0})\left(\frac{d_{c0}}{d_{cN0}}\right)^E \quad (5)$$

$$ES_1 = (OBG1 - PPG_{N1})\left(\frac{d_{c1}}{d_{cN1}}\right)^E \quad (6)$$

which may be represented as equation (7):

$$\left(\frac{d_{c0}}{d_{c1}}\right)^E = \left(\frac{d_{cN0}}{d_{cN1}}\right)^E \frac{ES_0}{ES_1} \frac{(OBG1 - PPG_{N1})}{(OBG0 - PPG_{N0})} \quad (7)$$

Both sonic logging data and resistivity logging data are indictors of ES. Therefore, values of sonic logging data and resistivity logging data are directly related to the ES for a given location. With a variation of TVD measurements, the values of ES are varied as well. When TVD measurements increase, ES will thus, increase and so will the value of (OBG−$PPG_N$). Therefore, it is reasonable to assume that:

$$\frac{ES_0}{ES_1} \frac{(OBG1 - PPG_{N1})}{(OBG0 - PPG_{N0})} \cong 1 \quad (8)$$

wherein the following relationship is obtained:

$$\left(\frac{d_{c0}}{d_{c1}}\right)^E = \left(\frac{d_{cN0}}{d_{cN1}}\right)^E \quad (9)$$

The exponential index E is the same on both sides of equation (9), thus there is the following relationship:

$$\frac{d_{c0}}{d_{c1}} = \frac{d_{cN0}}{d_{cN1}} \quad (10)$$

which may be rewritten as:

$$R = \frac{d_{cN0}}{d_{cN1}} \quad (11)$$

where R represents the right-side of equation (10). Alternatively, equation (12):

$$d_{c1} = d_{c0}R \quad (12)$$

may be obtained by substituting equation (11) into equation (10). In practice, the sonic logging data is given as sonic travel time dtc instead of sonic velocity dc, with dtc=1/dc. Therefore, equations (7, 9, 11, 12) become equations (13)-(16):

$$\left(\frac{d_{tc0}}{d_{tc1}}\right)^E = \left(\frac{d_{tcN0}}{d_{tcN1}}\right)^E \frac{ES_0}{ES_1} \frac{(OBG1 - PPG_{N1})}{(OBG0 - PPG_{N0})} \quad (13)$$

$$\frac{d_{tc0}}{d_{tc1}} = \frac{d_{tcN0}}{d_{tcN1}} \quad (14)$$

$$d_{tc1} = d_{tc0}R_t \quad (15)$$

$$R_t = \frac{d_{tcN0}}{d_{tcN1}} \quad (16)$$

On the other hand, with reference to equation (1), there is:

$$\ln(d_{tcNp0}) - \ln(d_{tcNp1}) = (TVDp1 - TVDp0)/C \quad (17)$$

which may be rewritten as equation (18):

$$d_{tcNp1} = d_{tcNp0}/e^{(TVDp1-TVDp0)/C} \quad (18)$$

Substituting equation (18) into equation (16) yields:

$$R_t = \frac{d_{tcNp0}}{d_{tcNp1}} = e^{(TVDp1-TVDp0)/C} \quad (19)$$

which may be rewritten as equation (2).

Figure 6:
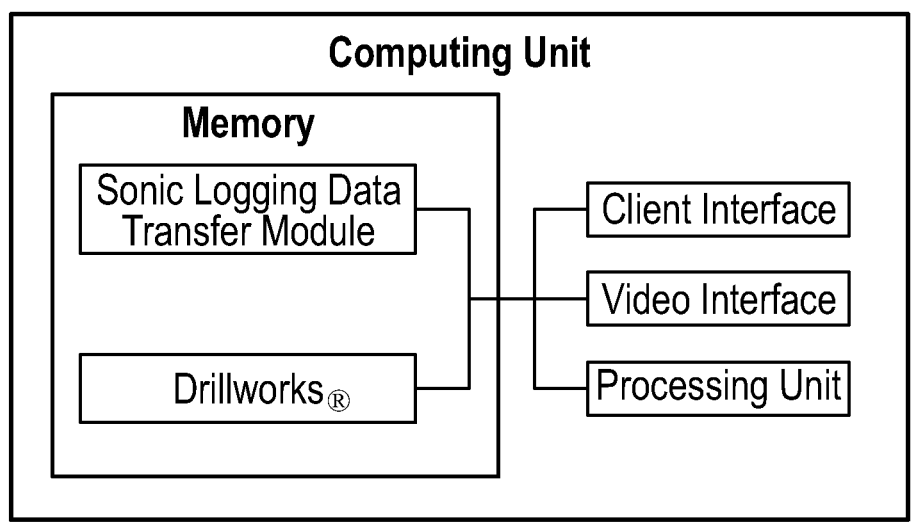
FIG. 6 is a block diagram illustrating one embodiment of a computer system for implementing the present disclosure.

In step 114, the TVD measurements for a target well and a nearest offset well are selected from the top-table extrapolated in step 107 using the client interface and/or the video interface described further in reference to FIG. 6. If there is more than one nearest offset well, then the offset well with the most logging data may be selected.

In step 116, the logging data from the location of the offset well selected in step 114 is transferred to the location of the target well selected in step 114 by multiplying the logging data at each TVD measurement for the selected offset well by the logging data ratio for each respective TVD measurement from the selected offset well calculated in step 112.

Equation (14) may thus, be used to effect the transfer where $d_{tc0}$ is the measured value of the sonic logging data acquired from the offset well at a given TVD measurement, $d_{tc1}$ is the calculated value of the sonic logging data for the target well at a correlated TVD measurement and Rt is the logging data ratio calculated in step 112 for the logging data at each respective TVD measurement from the offset well.

EXAMPLE

In table-1 below, a top-table correlates each TVD measurement for four formation tops (Top-Form) from an offset well (Well-1) with a respective TVD measurement for each formation top for two target wells (Target1 and Target2). Because the water depth is 1290 ft., the TVD measurement for the top of the first formation (Top-Form-1) is 1290 ft. The TVD measurements for the top of the other three formations vary at the location of each target well and the offset well, respectively.

TABLE 1

|  | TVD/ft (Well-1) 0 | TVD/ft (Target1) 0 | TVD/ft (Target2) 0 |
|---|---|---|---|
| Top-Form-1 | 1290 | 1290 | 1290 |
| Top-Form-2 | 5000 | 3000 | 2000 |
| Top-Form-3 | 10000 | 12000 | 8000 |
| Top-Form-4 | 15000 | 13000 | 9000 |

Figure 2:
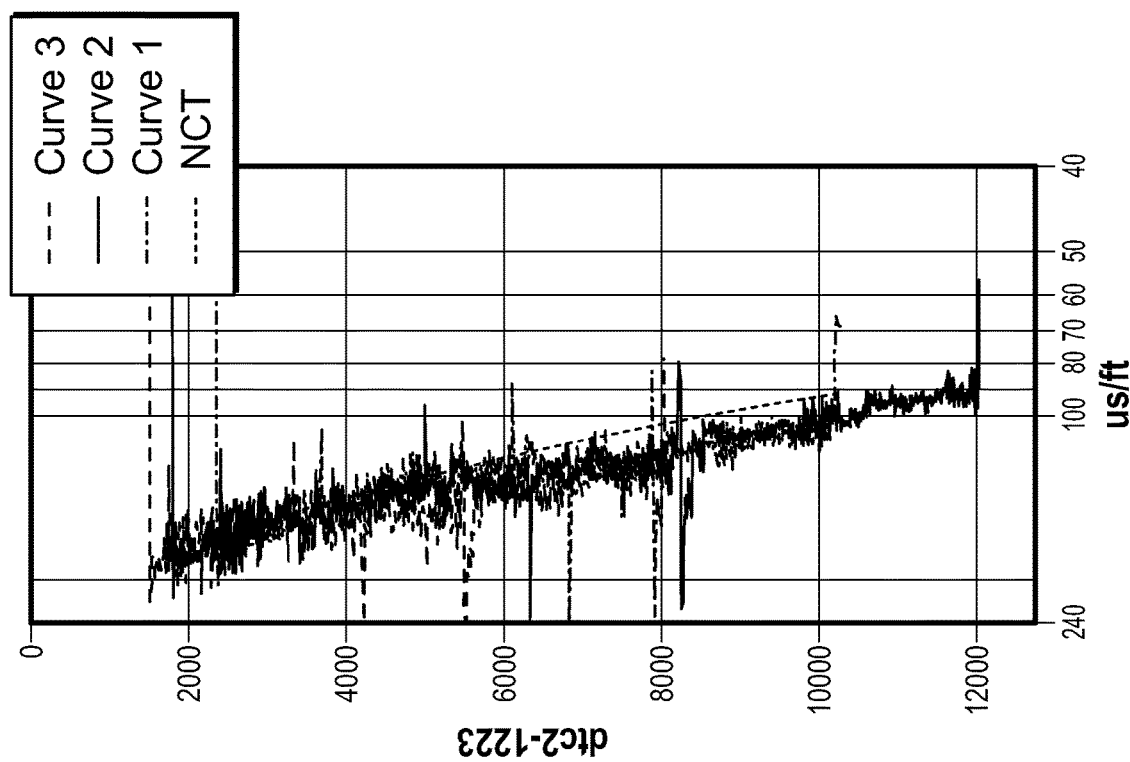
FIG. 2 is a sonic log illustrating the results of the method in FIGS. 1A-1B.
Figure 5:
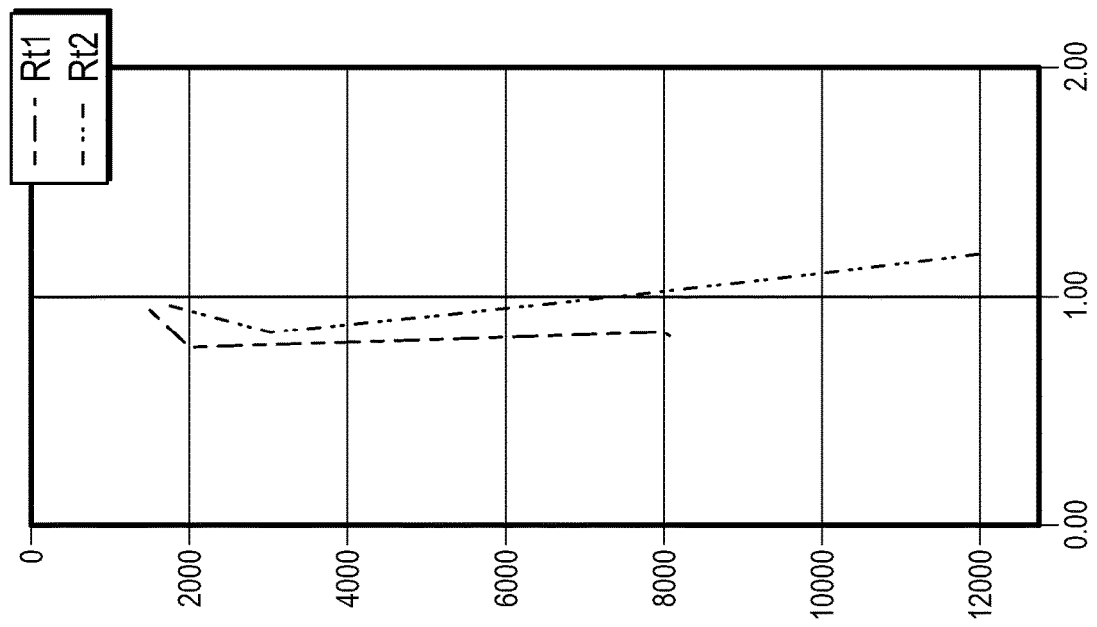
FIG. 5 is a sonic log illustrating logging data ratios calculated for two target wells according to step 112 in FIG. 1B.

Referring now to FIG. 2, a sonic log illustrates the results of the method 100 using i) table-1, and ii) real sonic logging data and a TVD measurement for each respective data point at which the sonic logging data was acquired from the offset well (Well-1). The logging data ratio used in this example is illustrated in FIG. 5 for Target1 (Rt1) and Target2 (Rt2). In FIG. 2, there are three sonic logging data curves. The first sonic logging data curve (Curve1) represents the sonic logging data at a respective TVD measurement (left margin) acquired from the offset well (Well-1). The second sonic logging data curve (Curve2) represents the sonic logging data transferred from the location of the offset well (Well-1) to the location of the first target well (Target1) at a respective TVD measurement. The third sonic logging data curve (Curve3) represents the sonic logging data transferred from the location of the offset well (Well-1) to the location of the second target well (Target2) at a respective TVD measurement. A comparison of the sonic logging data transferred to each target well (Target1 and Target2) location according to the method 100 confirms the accuracy of the method 100 because Curve1 and Curve 2 are close to each other at the same TVD measurement.

Figure 3:
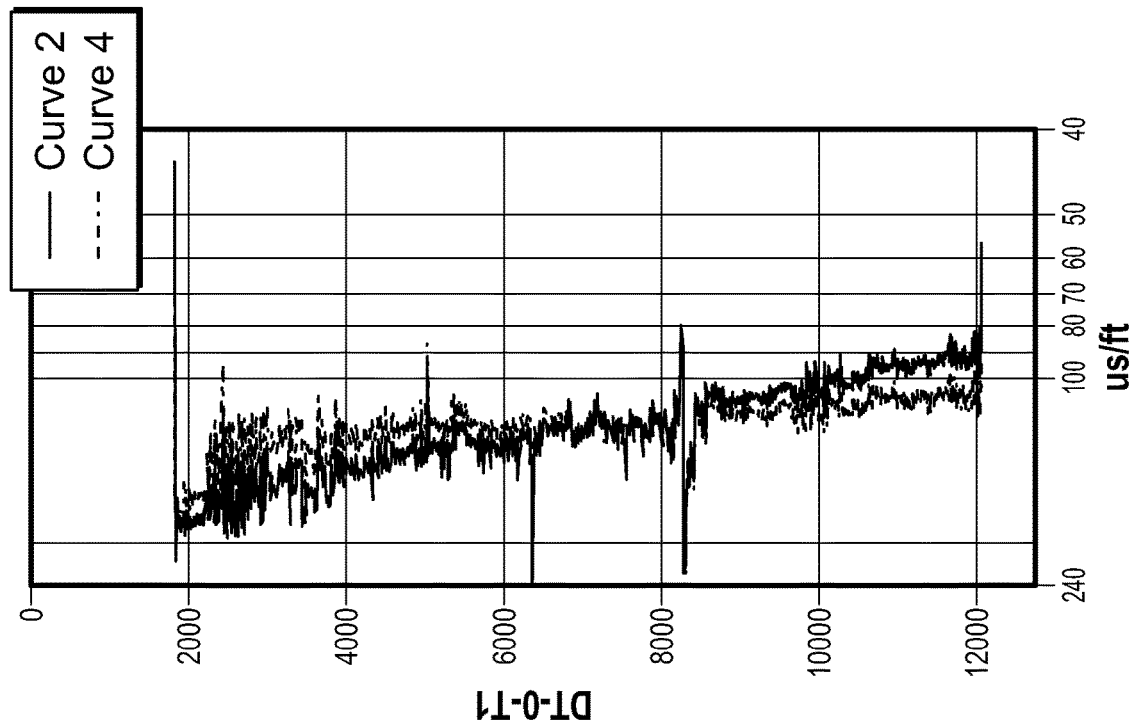
FIG. 3 is a sonic log illustrating a comparison of the results of the method in FIGS. 1A-1B and conventional means to transfer the sonic logging data from the location of an offset well to the location of a target well.
Figure 4:
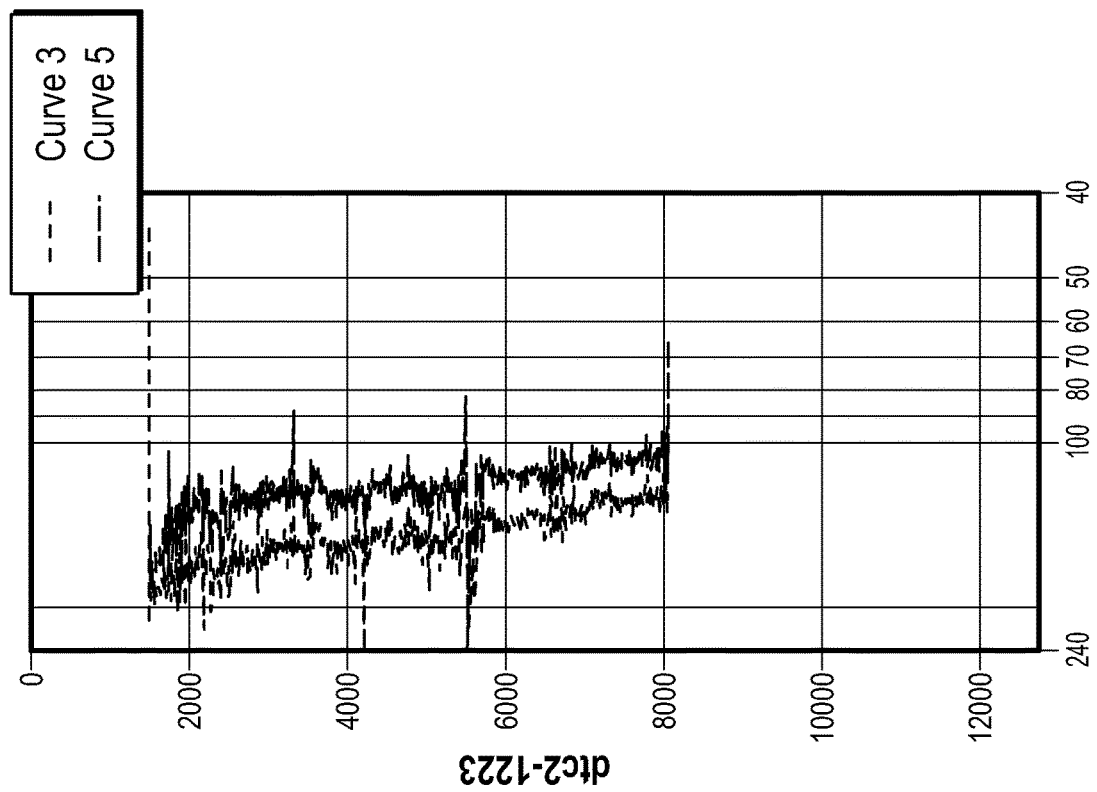
FIG. 4 is a sonic log illustrating a comparison of the results of the method in FIGS. 1A-1B and conventional means to transfer the sonic logging data from the location of an offset well to the location of another target well.

In FIG. 3, a sonic log illustrates a comparison of the sonic logging data transferred from the location of the offset well (Well-1) to the location of the first target well (Target1) using the method 100 described in reference to FIG. 2 (Curve 2) and conventional means (Curve4). In FIG. 4, a sonic log illustrates a comparison of the sonic logging data transferred from the location of the offset well (Well-1) to the location of the second target well (Target2) using the method 100 described in reference to FIG. 2 (Curve 3) and conventional means (Curve5). Curve2 in FIG. 3 becomes smaller than its original value in the upper part of the Target1 length and becomes larger than its original value at lower part of the Target1 length. This trend represents the normal trend of sedimentary history. Consequently, the sonic logging data transferred to any target well using the method 100 is more accurate than the sonic logging data transferred to any target well using conventional means.

System Description

The present disclosure may be implemented through a computer-executable program of instructions, such as program s, generally referred to as software applications or application programs executed by a computer. The software may include, for example, routines, programs, objects, components and data structures that perform particular tasks or implement particular abstract data types. The software forms an interface to allow a computer to react according to a source of input. Drillworks®, which is a commercial software application marketed by Landmark Graphics Corporation, may be used as an interface application to implement the present disclosure. The software may also cooperate with other code segments to initiate a variety of tasks in response to data received in conjunction with the source of the received data. The software may be stored and/or carried on any variety of memory such as CD-ROM, magnetic disk, bubble memory and semiconductor memory (e.g. various types of RAM or ROM). Furthermore, the software and its results may be transmitted over a variety of carrier media such as optical fiber, metallic wire and/or through any of a variety of networks, such as the Internet.

Moreover, those skilled in the art will appreciate that the disclosure may be practiced with a variety of computer-system configurations, including hand-held devices, multi-processor systems, microprocessor-based or programmable-consumer electronics, minicomputers, mainframe computers, and the like. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof, in a computer system or other processing system.

Referring now to FIG. 6, a block diagram illustrates one embodiment of a system for implementing the present disclosure on a computer. The system includes a computing unit, sometimes referred to as a computing system, which contains memory, application programs, a client interface, a video interface, and a processing unit. The computing unit is only one example of a suitable computing environment and is not intended to suggest any limitation as to the scope of use or functionality of the disclosure.

The memory primarily stores the application programs, which may also be described as program modules containing computer-executable instructions, executed by the computing unit for implementing the present disclosure described herein and illustrated in FIGS. 1A-1B and 2-5. The memory therefore, includes a sonic logging data transfer module, which enables steps 110-116 described in reference to FIGS. 1A-1B. The sonic logging data transfer module may integrate functionality from the remaining application programs illustrated in FIG. 6. In particular, Drillworks® may be used as an interface application to perform steps 102-108 in FIG. 1A. Although Drillworks® may be used as interface application, other interface applications may be used, instead, or the sonic logging data transfer module may be used as a stand-alone application.

Although the computing unit is shown as having a generalized memory, the computing unit typically includes a variety of computer readable media. By way of example, and not limitation, computer readable media may comprise computer storage media and communication media. The computing system memory may include computer storage media in the form of volatile and/or nonvolatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to, and/or presently being operated on, the processing unit. By way of example, and not limitation, the computing unit includes an operating system, application programs, other program modules, and program data.

The components shown in the memory may also be included in other removable/nonremovable, volatile/nonvolatile computer storage media or they may be implemented in the computing unit through an application program interface ("API") or cloud computing, which may reside on a separate computing unit connected through a computer system or network. For example only, a hard disk drive may read from or write to nonremovable, nonvolatile magnetic media, a magnetic disk drive may read from or write to a removable, nonvolatile magnetic disk, and an optical disk drive may read from or write to a removable, nonvolatile optical disk such as a CD ROM or other optical media. Other removable/nonremovable, volatile/nonvolatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above provide storage of computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, or the like. These and other input devices are often connected to the processing unit through the client interface that is coupled to a system bus, but may be connected by other interface and bus structures, such as a parallel port or a universal serial bus (USB).

A monitor or other type of display device may be connected to the system bus via an interface, such as a video interface. A graphical user interface ("GUI") may also be used with the video interface to receive instructions from the client interface and transmit instructions to the processing unit. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well-known.

While the present disclosure has been described in connection with presently preferred embodiments, it will be understood by those skilled in the art that it is not intended to limit the disclosure to those embodiments. It is therefore, contemplated that various alternative embodiments and modifications may be made to the disclosed embodiments without departing from the spirit and scope of the disclosure defined by the appended claims and equivalents thereof.

The invention claimed is:

1. A computer-based method for transferring logging data from an offset well location to a target well location, which comprises:
measuring true vertical depth (TVD) values for an offset well and a target well respectively;
compiling a top-table by correlating each TVD measurement from the offset well with a respective TVD measurement for a predicted trajectory of the target well;
calculating a normal compaction trend for the offset well using logging data for the offset well;
calculating an inclination of the normal compaction trend using any two TVD measurements from the offset well and the respective logging data at the two TVD measurements;
calculating a logging data ratio for the logging data at each respective TVD measurement from the offset well using the inclination, each TVD measurement from the offset well, each correlated TVD measurement for the target well from the top-table and a computer processor;
transferring the logging data from the location of the offset well to the location of the target well by multiplying the logging data at each TVD measurement for the offset well by the logging data ratio for each respective TVD measurement from the offset well; and
using the logging data transferred to the target well location to predict at least one of overburden stress, effective stress, and pore pressure along the predicted trajectory of the target well.

2. The method of claim 1, wherein each TVD measurement from the offset well corresponds with one of a formation top and a data point at which the logging data was acquired from the offset well.

3. The method of claim 1, wherein the logging data is one of sonic logging data and resistivity logging data.

4. The method of claim 1, wherein the logging data is acquired from the offset well during drilling operations.

5. The method claim 1, wherein the logging data is transferred to the target well location along the predicted trajectory of the target well.

6. The method of claim 1, wherein the inclination of the normal compaction trend is calculated using:

$$C = \frac{TVD_{p1} - TVD_{p0}}{\ln(d_{tcNP0}) - \ln(d_{tcNP1})}$$

where $d_{tcNP0}$ is the value of the sonic logging data acquired at the offset well location P0 with depth $TVD_{p0}$ and $d_{tcNP1}$ is the value of the sonic logging data at the offset well location P1 with depth $TVD_{p1}$.

7. The method of claim 6, wherein the logging data ratio is calculated using:

$$R_t = e^{(TVD1-TVD0)/C}$$

where TVD0 and TVD1 are the correlated TVD measurements for an offset well and a target well, respectively.

8. A non-transitory program carrier device tangibly carrying computer executable instructions for transferring logging data from an offset well location to a target well location, the instructions being executable to implement:
measuring true vertical depth (TVD) values for an offset well and a target well respectively;
compiling a top-table by correlating each TVD measurement from the offset well with a respective TVD measurement for a predicted trajectory of the target well;
calculating a normal compaction trend for the offset well using logging data for the offset well;
calculating an inclination of the normal compaction trend using any two TVD measurements from the offset well and the respective logging data at the two TVD measurements;
calculating a logging data ratio for the logging data at each respective TVD measurement from the offset well using the inclination, each TVD measurement from the offset well, and each correlated TVD measurement for the target well from the top-table;
transferring the logging data from the location of the offset well to the location of the target well by multiplying the logging data at each TVD measurement for the offset well by the logging data ratio for each respective TVD measurement from the offset well; and
using the logging data transferred to the target well location to predict at least one of overburden stress, effective stress, and pore pressure along the predicted trajectory of the target well.

9. The program carrier device of claim 8, wherein each TVD measurement from the offset well corresponds with one of a formation top and a data point at which the logging data was acquired from the offset well.

10. The program carrier device of claim 8, wherein the logging data is one of sonic logging data and resistivity logging data.

11. The program carrier device of claim 8, wherein the logging data is acquired from the offset well during drilling operations.

12. The program carrier device claim 8, wherein the logging data is transferred to the target well location along the predicted trajectory of the target well.

13. The program carrier device of claim 8, wherein the inclination of the normal compaction trend is calculated using:

$$C = \frac{TVD_{p1} - TVD_{p0}}{\ln(d_{tcNP0}) - \ln(d_{tcNP1})}$$

where $d_{tcNP0}$ is the value of the sonic logging data acquired at the offset well location P0 with depth $TVD_{p0}$ and $d_{tcNP1}$ is the value of the sonic logging data at the offset well location P1 with depth $TVD_{p1}$.

14. The program carrier device of claim 13, wherein the logging data ratio is calculated using:

$$R_t = e^{(TVD1-TVD0)/C}$$

where TVD0 and TVD1 are the correlated TVD measurements for an offset well and a target well, respectively.

15. A non-transitory program carrier device tangibly carrying computer executable instructions for transferring logging data from an offset well location to a target well location, the instructions being executable to implement:
measuring true vertical depth (TVD) values for an offset well and a target well respectively;
compiling a top-table by correlating each TVD measurement from the offset well with a respective TVD measurement for a predicted trajectory of the target well;

calculating an inclination of a normal compaction trend for the offset well using any two TVD measurements from the offset well and respective logging data for the offset well at the two TVD measurements;

calculating a logging data ratio for the logging data at each respective TVD measurement from the offset well using the inclination, each TVD measurement from the offset well, and each correlated TVD measurement for the target well from the top-table;

transferring the logging data from the location of the offset well to the location of the target well by multiplying the logging data at each TVD measurement for the offset well by the logging data ratio for each respective TVD measurement from the offset well; and using the logging data transferred to the target well location to predict at least one of overburden stress, effective stress, and pore pressure along the predicted trajectory of the target well.

16. The program carrier device of claim 15, wherein the inclination of the normal compaction trend is calculated using:

$$C = \frac{TVD_{p1} - TVD_{p0}}{\ln(d_{tcNP0}) - \ln(d_{tcNP1})}$$

where $d_{tcNP0}$ is the value of the sonic logging data acquired at the offset well location P0 with depth $TVD_{p0}$ and $d_{tcNP1}$ is the value of the sonic logging data at the offset well location P1 with depth $TVD_{p1}$.

17. The program carrier device of claim 16, wherein the logging data ratio is calculated using:

$$R_t = e^{(TVD1 - TVD0)/C}$$

where TVD0 and TVD1 are the correlated TVD measurements for an offset well and a target well, respectively.

18. The program carrier device of claim 15, wherein each TVD measurement from the offset well corresponds with one of a formation top and a data point at which the logging data was acquired from the offset well.

* * * * *